July 13, 1965 W. N. TOY 3,194,979
TRANSISTOR SWITCHING CIRCUIT
Filed Sept. 29, 1961
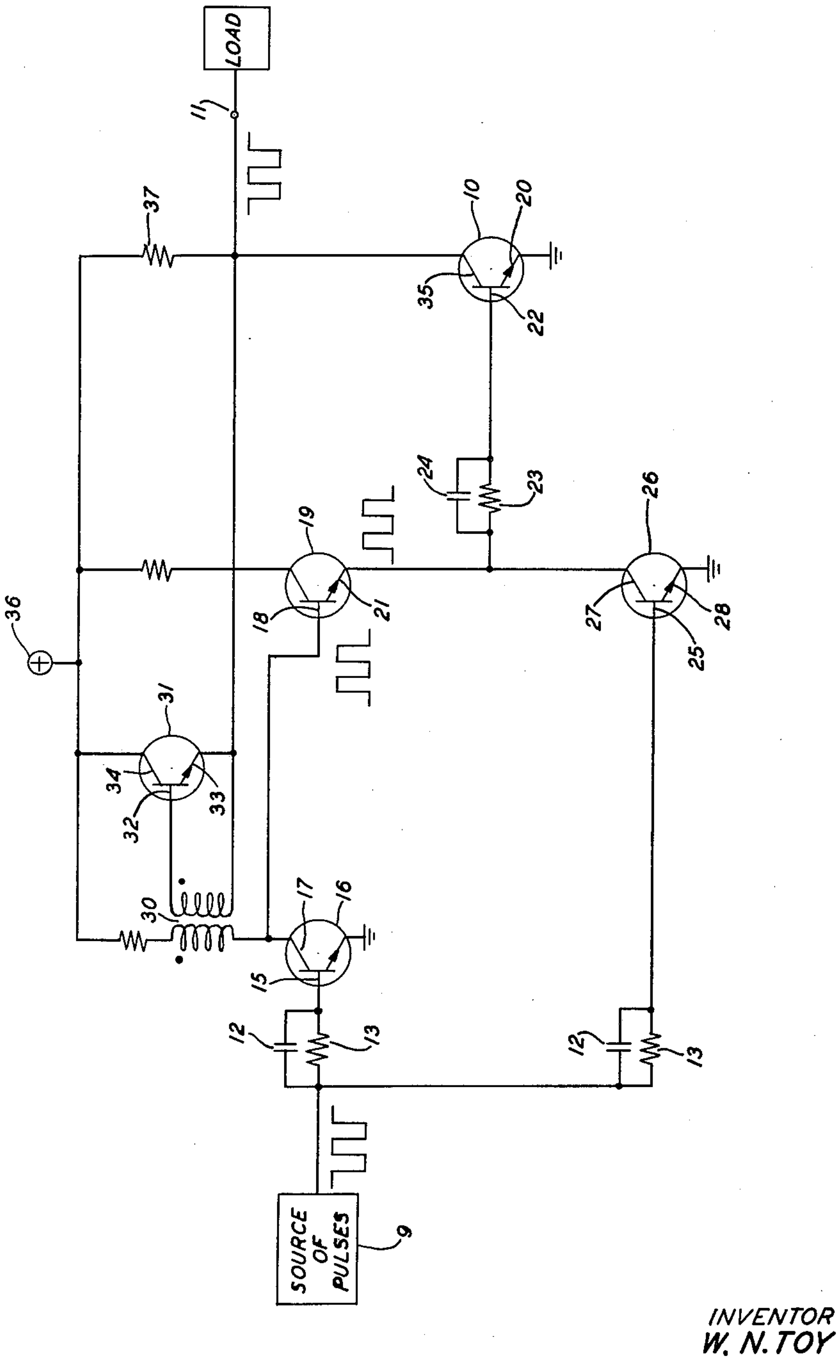
INVENTOR
W. N. TOY
BY R. B. Anderson
ATTORNEY

United States Patent Office 3,194,979
Patented July 13, 1965

3,194,979

TRANSISTOR SWITCHING CIRCUIT

Wing N. Toy, Berkeley Heights, N.J., assignor to Bell Telephone Laboratories, Incorporated, New York, N.Y., a corporation of New York Filed Sept. 29, 1961, Ser. No. 141,822
2 Claims. (Cl. 307—88.5)

This invention relates to transistor switching circuits and more particularly to transistorized pulse generators providing a wide range of current output.

As is well known, one of the major considerations in transistor switching circuit design is that of whether to employ the use of a saturated switch. In general the advantage of employing a saturated switch are the following: (1) simplicity of circuit design, (2) well defined voltage levels, (3) fewer components required than in non-saturating circuits, (4) low transistor dissipation when conducting, and (5) immunity to short stray voltage signals. Against these advantages must be weighed the general reduction in circuit speed which accompanies the use of saturated switches. This reduction in speed is primarily the result of the storage of minority current carriers which limit the speed at which the switch can be rendered non-conducting.

Another problem encountered in transistor switch design is that of the junction capacitance usually associated with relatively high current transistors. This junction capacitance limits the speed at which the transistor can be operated because of the time necessary to charge the stray capacitances.

It is an object of the applicant's invention to eliminate the general reduction in circuit speed encountered in saturated switch design.

Another object of the applicant's invention is to eliminate the adverse effect on circuit speed of junction capacitance.

It is a related object of this invention to provide a source of pulses capable of maintaining a desired pulse output shape over a considerable range of output currents.

In accordance with this invention a transistor switching circuit employs a high current power transistor driven into saturation but which avoids the effect of a reduction in circuit speed by synchronously connecting, by means of low impedance switches, the collector electrode of the power transistor to its collector voltage source and the base electrode to ground potential. The closing of the switches occurs at the conclusion of the desired period of conduction and the resulting conduction paths enable the minority current carriers to be more rapidly swept out of the base region thereby substantially eliminating the reduction in circuit speed usually associated with saturated switches. In addition, the junction capacitances associated with the transistor are charged extremely rapidly which further increases the circuit speed.

This invention will be more fully comprehended from the following detailed description of a preferred embodiment thereof taken in conjunction with the drawing which is a schematic diagram of a transistorized pulse generator embodying the invention.

A power transistor 10 capable of providing relatively high currents is used to supply the load circuits connected to output terminal 11. Power transistor 10 is driven into saturation in order to provide high output currents and this would usually result in a significant reduction in circuit speed due to the storage of minority current carriers. The power transistor 10 is, however, provided with associated circuitry, as shown in the drawing which eliminates such a reduction in circuit speed, and which also eliminates the adverse effects of junction capacitance.

Incoming negative going input pulses from source 9 are applied via an R–C coupling circuit 12, 13 to the base electrode 15 of the n-p-n type transistor amplifier 16 whose collector electrode 17 is connected to the base electrode 18 of emitter follower 19. A negative going input pulse is amplified by transistor 16 and the resulting positive pulse appears at the emitter 21 of emitter follower 19. Since emitter electrode 21 of emitter follower 19 is coupled to the base electrode 22 of power transistor 10 by R–C coupling circuit 23, 24, the negative going input pulse produces a positive pulse at the base electrode 22 of power transistor 10. The positive pulse at the base electrode 22 of transistor 10 is of sufficient amplitude to cause transistor 10 to conduct and be driven into saturation.

Upon the conclusion of the negative going input pulse transistor 26, whose base electrode 25 is connected to source 9 by means of a second R–C coupling circuit 12, 13, conducts heavily and the voltage at its collector electrode 27 is substantially the voltage at its emitter electrode 28 which is connected to ground potential. Since the collector electrode 27 of transistor 26 is connected to the base electrode 22 of transistor 10 by means of coupling circuit 23, 24, the base electrode 22 of transistor 10 is thus effectively connected to ground potential. Any minority carriers stored in the base region of transistor 10 now have a low impedance path to ground and this enables them to be swept out of the base region relatively rapidly thereby reducing the minority carrier storage time so that transistor 10 ceases to conduct more rapidly after the termination of an input pulse from source 9 than would otherwise be the case.

In addition, the availability of a high current output from transistor 10, while maintaining a rectangular pulse shape, is facilitated by the use of a transformer 30 and an n-p-n type transistor 31. The collector electrode 17 of transistor 16 is connected to the primary winding of transformer 30 whose secondary winding is connected between the base electrode 32 and emitter electrode 33 of transistor 31. The polarity of transformer 30 is such that a drop in voltage at the collector electrode 17 of transistor 16 results in an increase in voltage at the base electrode 32 of transistor 31 causing that transistor to conduct heavily. Thus at the termination of a negative input pulse, transistor 31 will conduct heavily and the voltage at its emitter electrode 33 will be substantially the same as the voltage at its collector electrode 34. The emitter electrode 33 is connected directly to the collector electrode 35 of transistor 10 while the collector electrode of transistor 31 is connected directly to collector voltage source 36. During the presence of an input pulse from source 9 the collector electrode 35 of transistor 10 is connected to source 36 by means of a resistor 37 which provides the proper collector emitter bias voltage. When the input pulse terminates, however, the collector electrode 35 is immediately connected to source 36 by means of the low impedance path through transistor switch 31. This provides another path in which the minority carriers stored in the base region of the transistor 10 may be swept out of the base region, and thereby increases the speed at which they are eliminated from the base region. This enables transistor 10 to cease conducting more rapidly with the result that a rectangular output pulse is produced having a sharp trailing edge. In addition this technique eliminates the adverse effects of junction capacitance on the trailing edge of the pulse output signal. Power transistors such as transistor 10 have associated therewith relatively high values of junction capacitance. Thus when the transistor 10 ceases to conduct the output voltage cannot rise instantaneously even if we neglect the effect of minority carrier storage time since it takes time for that capacitance to charge up. This charging time is governed by the resistance of resistor 37 and the junction capacitance and in the past to reduce this adverse effect on the trailing edge of the output pulse the value of resistor 37 has been reduced to reduce the resulting time constant. Reduction of the resistance of resistor 37 has, however, increased the power consumed by the circuit and limited the load current. In accordance with this invention, however, this effect is overcome by the above-described technique in that the junction capacitance is immediately charged, at the conclusion of an input pulse, through low impedance switch 31 which bypasses resistor 37 at the conclusion of the input pulse.

Thus in accordance with this invention the above-recited advantages of employing a saturated switch are employed in a circuit without the usually attendant disadvantage in reduction of circuit speed. Minority current carriers are rapidly swept out of the base region of the saturated switch and this causes the transistor to cease conducting in a shorter period of time and produces a substantially rectangular output pulse having a vertical trailing edge. In addition, the resulting pulse generator may be operated at higher pulse repetition rates than would otherwise be the case since the pulse repetition rate is no longer limited by minority carrier storage delay. Thus the use of a saturated switch in accordance with the invention provides relatively high current output with no degradation of output pulse shape due to minority current storage delay, a combination heretofore unobtainable. Finally in accordance with this invention the problem of junction capacitance associated with transistorized switches is eliminated, and this results in the use of high current power transistors without the attendant disadvantage of degradation of the output pulse due to junction capacitance.

It is to be understood that the above-described arrangements are illustrative of the application of the invention. Numerous other arrangements may be devised by those skilled in the art without departing from the spirit and scope of the invention.

What is claimed is:

1. A transistor switching circuit comprising, in combination, a first transistor of a given conductivity type having a base electrode, an emitter electrode, and a collector electrode, a source of collector voltage, a biasing resistor connecting said source of collector voltage to said collector electrode of said first transistor, means connecting said emitter electrode of said first transistor to ground potential, means connecting a source of substantially rectangular pulses between said base and said emitter electrodes of said first transistor, the amplitude of said pulses applied between said base and emitter electrodes of said first transistor being sufficient to drive said transistor into a condition of collector current saturation in which minority carriers are stored, means to reduce the minority carrier storage time in said first transistor comprising a second transistor of the same conductivity type as said first transistor having a base electrode, an emitter electrode, and a collector electrode, means connecting said source of substantially rectangular pulses between said base and said emitter electrodes of said second transistor so that said second transistor conducts upon the termination of a pulse from said source of pulses, means connecting the collector electrode of said second transistor to said source of collector voltage, means connecting the emitter electrode of said second transistor to said collector electrode of said first transistor so that upon the termination of a pulse from said source of pulses the collector electrode of said first transistor is connected to said source of collector voltage, a third transistor of the same conductivity type as said first and second transistors having a base electrode, an emitter electrode and a collector electrode, said base electrode of said third transistor being connected to said source of pulses, said emitter electrode of said third transistor being connected to ground potential, and said collector electrode of said third transistor being connected to said base electrode of said first transistor to connect said base electrode of said first transistor to ground potential upon the termination of a pulse from said source of pulses.

2. A transistor switching circuit comprising, in combination, a first transistor of a given conductivity type having a base electrode, an emitter electrode, and a collector electrode, a source of collector voltage, a biasing resistor connecting said source of collector voltage to said collector electrode of said first transistor, means connecting said emitter electrode of said first transistor to ground potential, a source of substantially rectangular pulses, first polarity-inverting amplifying means connected between said source of pulses and said base electrode of said first transistor, the amplitude of the amplified inverted pulses being sufficient to drive said first transistor into a condition of collector current saturation in which minority carriers are stored, a second transistor of the same conductivity type as said first transistor having a base electrode, an emitter electrode, and a collector electrode, polarity-inverting transformer means connected between said first polarity-inverting amplifier means and the base-emitter circuit of said second transistor so that said second transistor conducts upon the termination of a pulse from said source of pulses, means connecting the collector electrode of said second transistor to said source of collector voltage, means connecting said emitter electrode of said second transistor to said collector electrode of said first transistor so that upon the termination of a pulse from said source of pulses said second transistor conducts and connects the collector electrode of said first transistor to said collector voltage source, a third transistor of the same conductivity type as said first transistor having a base electrode, an emitter electrode, and a collector electrode, means connecting the collector electrode of said third transistor to said base electrode of said first transistor, means connecting the emitter electrode of said third transistor to ground potential, and means connecting the base electrode of said third transistor to said source of pulses so that said third transistor conducts upon the termination of a pulse from said source of pulses and connects said base electrode of said first transistor to ground potential.

References Cited by the Examiner

UNITED STATES PATENTS

| | | | |
|---|---|---|---|
| 2,981,850 | 4/61 | Hoskinson | 307—88.5 |
| 2,997,606 | 8/61 | Hamburger et al. | 307—88.5 |
| 3,091,705 | 5/63 | Levine | 307—88.5 |

ARTHUR GAUSS, *Primary Examiner.*

GEORGE N. WESTBY, *Examiner.*